(12) United States Patent
Nakamura et al.

(10) Patent No.: US 11,094,567 B2
(45) Date of Patent: Aug. 17, 2021

(54) MOUNTING APPARATUS AND METHOD FOR MANUFACTURING SEMICONDUCTOR DEVICE

(71) Applicant: SHINKAWA LTD., Tokyo (JP)

(72) Inventors: Tomonori Nakamura, Tokyo (JP); Toru Maeda, Tokyo (JP); Tetsuo Takano, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 75 days.

(21) Appl. No.: 16/624,302

(22) PCT Filed: May 29, 2018

(86) PCT No.: PCT/JP2018/020505
§ 371 (c)(1),
(2) Date: Apr. 13, 2020

(87) PCT Pub. No.: WO2018/221499
PCT Pub. Date: Dec. 6, 2018

(65) Prior Publication Data
US 2020/0243356 A1 Jul. 30, 2020

(30) Foreign Application Priority Data

May 29, 2017 (JP) .............................. JP2017-105614

(51) Int. Cl.
*H01L 21/67* (2006.01)
*H01L 21/50* (2006.01)
(Continued)

(52) U.S. Cl.
CPC ........ *H01L 21/67115* (2013.01); *H01L 21/50* (2013.01); *H01L 24/80* (2013.01); *H01L 24/94* (2013.01); *H01L 2021/60105* (2013.01)

(58) Field of Classification Search
None
See application file for complete search history.

(56) References Cited

U.S. PATENT DOCUMENTS

2008/0268571 A1\* 10/2008 Kim .................. B23K 26/0626
438/108
2013/0340943 A1\* 12/2013 Yoshida .................. H01L 24/75
156/380.9
(Continued)

FOREIGN PATENT DOCUMENTS

JP        3833531       10/2006
JP        4001341       10/2007
(Continued)

OTHER PUBLICATIONS

"International Search Report (Form PCT/ISA/210) of PCT/JP2018/020505," dated Aug. 7, 2018, with English translation thereof, pp. 1-2.

*Primary Examiner* — Alexander G Ghyka
(74) *Attorney, Agent, or Firm* — JCIPRNET

(57) ABSTRACT

A mounting apparatus for manufacturing a semiconductor device by bonding a semiconductor chip (12) to a mounted object that is a substrate (30) or another semiconductor chip (12) is provided. The mounting apparatus includes: a stage (120) on which the substrate (30) is placed, a mounting head (124) that is capable of moving relative to the stage (120) and bonds the semiconductor chip (12) to the mounted object, and an irradiation unit (108 that irradiates, from a lower side of the stage (120), an electromagnetic wave transmitting through the stage and heating the substrate (30). The stage (120) has a first layer (122) formed on an upper surface side, and the first layer (122) has a greater thermal resistance in a plane direction than the thermal resistance in a thickness direction.

18 Claims, 5 Drawing Sheets

(51) Int. Cl.
 H01L 23/00 (2006.01)
 H01L 21/60 (2006.01)

(56) References Cited

U.S. PATENT DOCUMENTS

| | | | |
|---|---|---|---|
| 2017/0301560 A1* | 10/2017 | Yoon | H01L 24/75 |
| 2017/0365578 A1* | 12/2017 | Nakamura | H01L 24/75 |
| 2019/0067235 A1* | 2/2019 | Choi | B23K 1/0056 |
| 2020/0135688 A1* | 4/2020 | Huska | H01L 24/75 |

FOREIGN PATENT DOCUMENTS

| | | |
|---|---|---|
| JP | 2016162920 | 9/2016 |
| WO | 2010050209 | 5/2010 |

\* cited by examiner

MOUNTING APPARATUS AND METHOD FOR MANUFACTURING SEMICONDUCTOR DEVICE

CROSS-REFERENCE TO RELATED APPLICATION

This application is a 371 application of the International PCT application serial no. PCT/JP2018/020505, filed on May 29, 2018, which claims the priority benefit of Japan Patent Application No. 2017-105614, filed on May 29, 2017. The entirety of each of the abovementioned patent applications is hereby incorporated by reference herein and made a part of this specification.

BACKGROUND OF THE INVENTION

Technical Field

The specification discloses a mounting apparatus for manufacturing a semiconductor device by bonding a semiconductor chip to a mounted object that is a substrate or another semiconductor chip and discloses a manufacturing method of semiconductor device.

Related Art

When a semiconductor chip is bonded onto a substrate or another semiconductor chip, the semiconductor chip is usually heated and pressurized by a heated mounting head. However, it is difficult to appropriately heat the semiconductor chip which is a bonding target only by the heat from the mounting head. Particularly, in recent years, it has been proposed to laminate and mount a plurality of semiconductor chips in order to further enhance functionality and reduce a size of a semiconductor device. In this case, in order to reduce time for a mounting process, a plurality of semiconductor chips may be temporarily compress-bonded and laminated, and then the plurality of semiconductor chips is finally compress-bonded collectively. That is, a plurality of semiconductor chips may be laminated in a temporarily compress-bonded state to form a temporarily-laminated body, and then an upper surface of the temporarily-laminated body is heated and pressurized by a heated mounting head to perform the final compress-bonding. In this case, it is difficult to appropriately heat the lowermost semiconductor chip of the temporarily-laminated body only by the heat from the mounting head. Therefore, conventionally, when a semiconductor device is bonded, the entire stage with the substrate placed thereon is heated. Accordingly, heating can be performed from both upper and lower sides of a semiconductor chip.

Literature of Related Art

Patent Literature

Patent literature 1: International Publication No. 2010/050209
Patent literature 2: Japanese Patent No. 3833531
Patent literature 3: Japanese Patent No. 4001341

SUMMARY

Problems to be Solved

However, when the entire stage is heated, a semiconductor chip arranged at a place different from the semiconductor chip which is the bonding target (the heating target) is also continuously heated. As a result, heat is input to the semiconductor chip for a long time. This long-term heat input causes deterioration of the semiconductor chip, particularly a resin such as a non-conductive film or the like arranged on a bottom surface of the semiconductor chip, and consequently causes a decrease in mounting quality.

In order to avoid the aforementioned problem, it is conceivable to arrange a heater for local heating such as a pulse heater or the like at a plurality of places on the stage and to turn on only the heater at necessary places. However, when the heater for local heating is embedded in the stage, it is difficult to maintain flatness of the stage, and consequently causes the decrease in mounting quality.

In addition, patent literatures 1-3 disclose techniques for optically heating a substrate by light irradiated from a back side of a stage, but none of these techniques is fully considered for locally heating the substrate.

Therefore, the specification provides a mounting apparatus capable of appropriately heating a semiconductor chip which is a bonding target and suppressing heat input to another semiconductor chip and provides a manufacturing method of semiconductor device.

Means to Solve Problems

A mounting apparatus disclosed in the specification is configured for manufacturing a semiconductor device by bonding a semiconductor chip to a mounted object that is a substrate or another semiconductor chip. The mounting apparatus includes: a stage which has a first surface on which the substrate is placed directly or via an intermediate member and a second surface opposite to the first surface; a mounting head that is capable of moving relative to the stage and bonds the semiconductor chip to the mounted object; and an irradiation unit that irradiates, from the second surface side, an electromagnetic wave transmitting through the stage and heating the substrate or the intermediate member, wherein the stage has a first layer formed on the first surface side, and the first layer has a greater thermal resistance in a plane direction than the thermal resistance in a thickness direction.

A plurality of semiconductor chips may be thermally compress-bonded on the substrate, and the irradiation unit may have a change part which changes at least one of an irradiation region of the electromagnetic wave on the first surface and an irradiation position of the electromagnetic wave on the first surface.

In addition, the mounting head may have a heater which performs final compress-bonding by heating a temporarily-laminated body laminated in a state that the plurality of semiconductor chips is temporarily compress-bonded, and the irradiation unit may heat the temporarily-laminated body together with the heater.

In addition, the stage may further have a second layer formed closer to the second surface side than the first layer, and the first layer may have a larger thermal resistance in the plane direction than the second layer.

In addition, the second layer may have higher rigidity than the first layer.

In addition, the second layer may be a solid portion made of a material through which the electromagnetic wave can transmit, and the first layer may be a portion in which a plurality of grooves is formed in an upper surface or a plurality of pores is formed in the layer.

In addition, the substrate may be a silicon wafer and may be directly placed on the stage, the electromagnetic wave may have a wavelength of 1200 nm or less, and the substrate may be locally heated by the electromagnetic wave.

In addition, the substrate may be placed on the stage via the intermediate member, the electromagnetic wave may have a wavelength which is absorbed by the intermediate member but not absorbed by the substrate, and the substrate may be locally heated by heat transfer from the intermediate member locally heated by the electromagnetic wave.

A manufacturing method of semiconductor device disclosed in the specification manufactures a semiconductor device by bonding a semiconductor chip to a mounted object that is a substrate or another semiconductor chip. The manufacturing method includes: a placing step for placing the substrate on a first surface of a stage directly or via an intermediate member; a bonding step for bonding the semiconductor chip to the mounted object by a mounting head that is capable to moving relative to the stage; and a substrate heating step which is performed in parallel with at least a part of the bonding step and in which the substrate or the intermediate member is heated by irradiating, from an irradiation unit which is arranged opposite to the mounting head across the stage, an electromagnetic wave which is absorbed by the substrate or the intermediate member and transmits through the stage, wherein the stage has a first layer formed on the first surface side, and the first layer has greater a thermal resistance in a plane direction than the thermal resistance in a thickness direction.

The bonding step may include: a temporary compress-bonding step for sequentially forming, at a plurality of places of the substrate, temporarily-laminated bodies obtained by temporarily compress-bonding and laminating one or more semiconductor chips on the substrate by the mounting head; and a final compress-bonding step for sequentially performing, at the plurality of places of the substrate after the temporary compress-bonding step, processing of finally compress-bonding one or more semiconductor chips configuring one temporarily-laminated body collectively by heating and pressurizing the temporarily-laminated body from an upper surface thereof, wherein in the substrate heating step, the electromagnetic wave may be irradiated, in parallel with the processing of finally compress-bonding the semiconductor chips collectively, on places of the substrate or the intermediate member corresponding to the places where the final compress-bonding is performed.

Effect

According to the apparatus and the method disclosed in the specification, the substrate is locally heated by the electromagnetic wave, and thus the semiconductor chip which is the bonding target can be appropriately heated. In addition, the first layer of the stage has a higher thermal resistance in the plane direction than the thermal resistance in the thickness direction, and thus the heat transfer to another semiconductor chip spaced apart in the plane direction is suppressed, and consequently the heat input to another semiconductor chip is suppressed.

DESCRIPTION OF THE EMBODIMENTS

Figure 1:
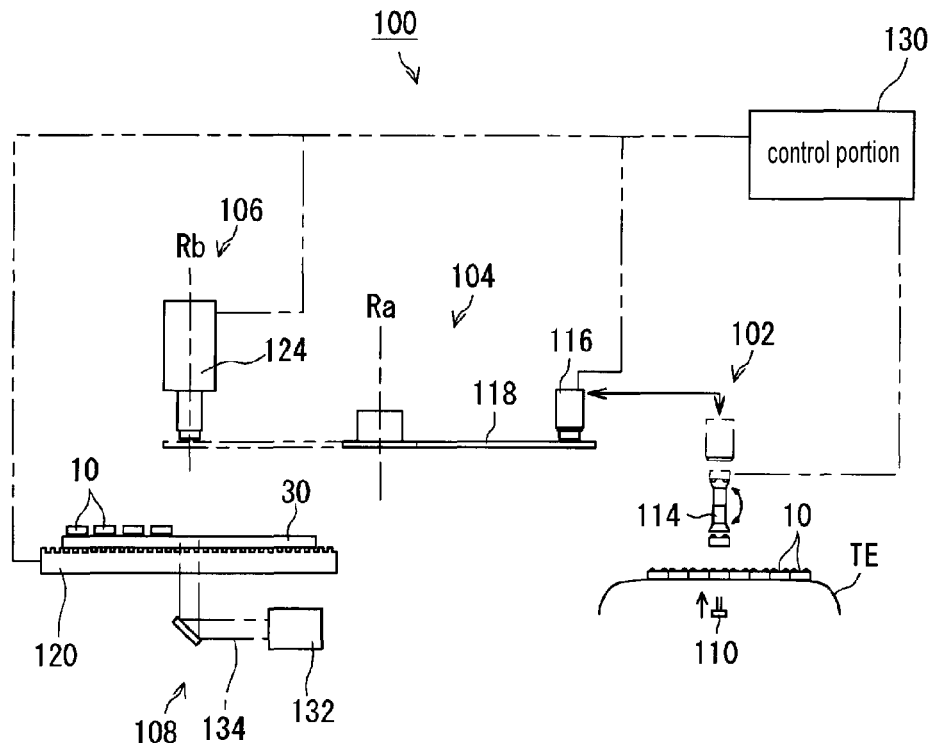
FIG. 1 is a diagram showing a configuration of a mounting apparatus.

A manufacturing method of semiconductor device and a mounting apparatus 100 are described below with reference to the drawings. FIG. 1 is a diagram showing a configuration of the mounting apparatus 100. The mounting apparatus 100 is an apparatus for mounting a semiconductor chip 12 on a substrate 30. The mounting apparatus 100 has a configuration particularly suitable for a case where a plurality of semiconductor chips 12 is laminated and mounted. Moreover, in the following description, among laminated bodies formed by laminating the plurality of semiconductor chips 12, a laminated body in which the plurality of semiconductor chips 12 configuring the laminated body is in a temporarily compress-bonded state is referred to as a "temporarily-laminated body STt", and a laminated body in which the plurality of semiconductor chips 12 is in the finally compress-bonded state is referred to as a "chip laminated body STc" for distinguishing.

The mounting apparatus 100 includes a chip supply unit 102, a chip conveyance unit 104, a bonding unit 106, an irradiation unit 108, and a control portion 130 that controls driving of these units. The chip supply unit 102 is a portion that takes out a semiconductor chip 12 from a chip supply source and supplies the semiconductor chip 12 to the chip conveyance unit 104. The chip supply unit 102 includes a push-up portion 110, a die-picker 114, and a transfer head 116.

In the chip supply unit 102, a plurality of semiconductor chips 12 is placed on a dicing tape TE. At this time, the semiconductor chips 12 are placed in a face-up state in which bumps 18 face upward. The push-up portion 110 pushes up only one semiconductor chip 12 from the plurality of semiconductor chips 12 in the face-up state. The die-picker 114 receives the semiconductor chip 12 pushed up by the push-up portion 110 while sucking and holding the semiconductor chip 12 with a lower end of the die-picker 114. The die-picker 114 that has received the semiconductor chip 12 rotates 180 degrees on the spot in a manner that the bump 18 of the semiconductor chip 12 faces down, that is, the semiconductor chip 12 comes into a face-down state. In this state, the transfer head 116 receives the semiconductor chip 12 from the die-picker 114.

The transfer head 116 is movable vertically and horizontally and can suck and hold the semiconductor chip 12 with a lower end of the transfer head 116. When the die-picker 114 rotates 180 degrees and the semiconductor chip 12 comes into the face-down state, the transfer head 116 sucks and holds the semiconductor chip 12 with the lower end of the transfer head 116. Thereafter, the transfer head 116 moves vertically and horizontally and moves to the chip conveyance unit 104.

The chip conveyance unit 104 has a rotary table 118 that rotates around a vertical rotation axis Ra. The transfer head 116 places the semiconductor chip 12 at a predetermined position on the rotary table 118. By rotating the rotary table 118 on which the semiconductor chip 12 is placed around the rotation axis Ra, the semiconductor chip 12 is conveyed to the bonding unit 106 positioned opposite to the chip supply unit 102.

The bonding unit 106 includes a stage 120 for supporting the substrate 30 and a mounting head 124 for attaching the semiconductor chip 12 to the substrate 30. The stage 120 has an upper surface (a first surface) on which the substrate 30 is placed, and a lower surface (a second surface) opposite to the first surface. In addition, the stage 120 is movable horizontally and adjusts a relative positional relationship between the substrate 30 placed thereon and the mounting head 124. As described later in detail, the stage 120 is configured by a material through which an electromagnetic wave 134 irradiated from the irradiation unit 108 can transmit. In addition, the stage 120 has a multilayer structure having a first layer with a higher thermal resistance in a plane direction than the thermal resistance in a thickness direction and a second layer disposed below the first layer, which is also described later.

The mounting head 124 laminates and mounts a plurality of semiconductor chips 12 on the substrate 30. The mounting head 124 can hold the semiconductor chips 12 at a lower end of the mounting head 124, and can rotate around the vertical rotation axis Rb and move up and down. The mounting head 124 compress-bonds a semiconductor chip 12 onto the substrate 30 or another semiconductor chip 12. Specifically, the mounting head 124 is lowered to press the semiconductor chip 12 being held against the substrate 30 or the like, and thereby the semiconductor chip 12 is temporarily or finally compress-bonded. The mounting head 124 has a built-in temperature-variable heater (not shown), and the mounting head 124 is heated to a first temperature T1 when performing the temporary compress-bonding and to a second temperature T2 higher than the first temperature T1 when performing the final compress-bonding. In addition, the mounting head 124 applies a first load F1 to the semiconductor chip 12 when performing the temporary compress-bonding, and applies a second load F2 to the semiconductor chip 12 when performing the final compress-bonding.

A camera (not shown) is arranged near the mounting head 124. The substrate 30 and the semiconductor chip 12 are each arranged with an alignment mark as a reference for positioning. The camera takes an image of the substrate 30 and the semiconductor chip 12 in a manner that the alignment mark are reflected. The control portion 130 grasps the relative positional relationship between the substrate 30 and the semiconductor chip 12 based on image data obtained by the imaging, and adjusts a rotation angle of the mounting head 124 around the axis Rb and a horizontal position of the stage 120 if necessary.

The irradiation unit 108 locally heats the substrate 30 by irradiating the electromagnetic wave 134 having a specific wavelength from a back side of the stage 120. The irradiation unit 108 has at least an electromagnetic wave source 132 for irradiating the electromagnetic wave 134. The electromagnetic wave 134 is not particularly limited as long as it has a wavelength that easily transmits through the stage 120 and is easily absorbed by the substrate 30; however, in consideration of output or directivity, the electromagnetic wave 134 is desirably laser light. The electromagnetic wave source 132 is not particularly limited as long as light having a desired wavelength and power can be irradiated at a desired power, and for example, a laser oscillator, a LD (Laser Diode), a LED, a Halogen lamp, or the like may be used. In order to irradiate the electromagnetic wave 134 to only a specific range of the substrate 30, the irradiation unit 108 may further have an optical member such as a diaphragm, a lens, a mirror, an optical fiber or the like, a drive member which drives these optical members to scan the electromagnetic wave, and the like.

The control portion 130 controls the driving of each portion, and includes, for example, a CPU that performs various calculations and a storage portion that stores various data and programs. The control portion 130 drives each portion according to the programs stored in the storage portion to execute the mounting process of the semiconductor chip. For example, the control portion 130 drives the mounting head 124 and the stage 120 to mount the semiconductor chip on the substrate 30. In addition, the control portion 130 drives the irradiation unit 108 to locally heat the substrate 30 in parallel with a final compress-bonding processing described later.

Figure 2:
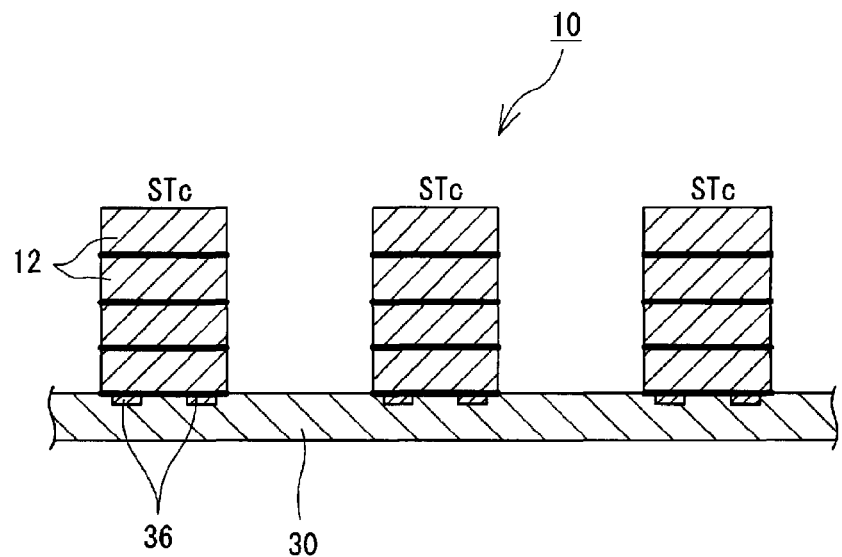
FIG. 2 is a diagram showing one example of a semiconductor device.
Figure 3:
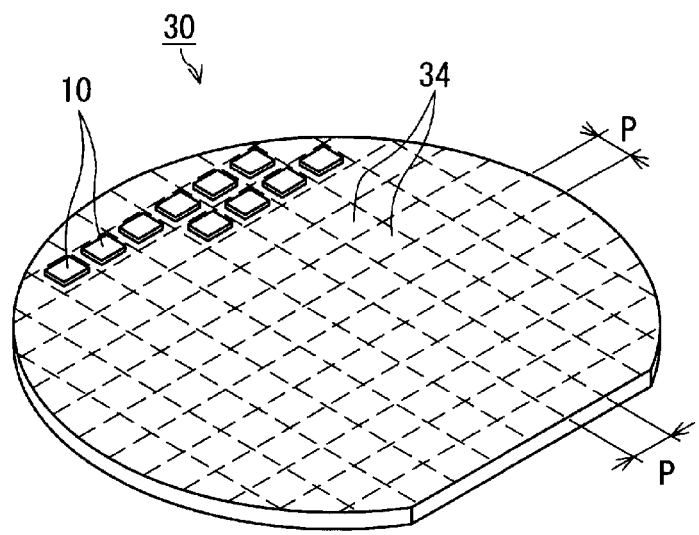
FIG. 3 is a diagram showing one example of a substrate.
Figure 4:
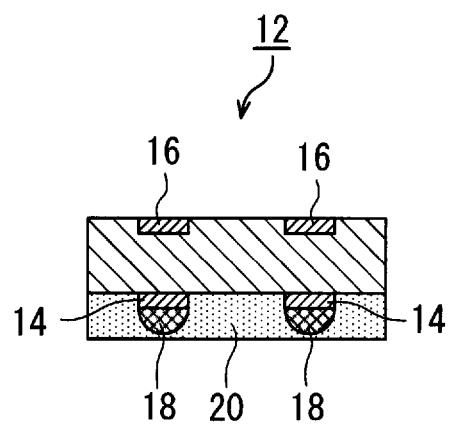
FIG. 4 is a diagram showing one example of a semiconductor chip.

Next, a semiconductor device 10 manufactured by the mounting apparatus 100 is described with reference to FIG. 2-FIG. 4. FIG. 2 is a schematic diagram showing one example of the semiconductor device 10, FIG. 3 is a schematic diagram of the substrate 30, and FIG. 4 is a schematic diagram of the semiconductor chip 12. Moreover, in FIG. 2, thick lines at a boundary between the semiconductor chip 12 and the substrate 30 and at a boundary between two semiconductor chips 12 indicate that the final compress-bonding is performed.

In the semiconductor device 10 handled in the example, as shown in FIG. 2, a plurality (four in the illustrated example) of semiconductor chips 12 is laminated and mounted on an upper surface of the substrate 30. In addition, in the example, a silicon wafer is used as the substrate 30. Therefore, the mounting process disclosed in the specification is a "chip-on-wafer process" in which the semiconductor chips 12 are laminated and mounted on a circuit formation surface of the silicon wafer.

The substrate 30 which is a silicon wafer is mainly made of silicon, and has a higher thermal conductivity than a general substrate made of resin or glass. As shown in FIG. 3, a plurality of mounting sections 34 arranged in a grid shape is set on the substrate 30. In each mounting section 34, a plurality of semiconductor chips 12 is laminated and mounted. The mounting sections 34 are arranged at a predetermined arrangement pitch P. The value of the arrangement pitch P is appropriately set according to a size of the semiconductor chip 12 which is a mounting target. In addition, in the embodiment, the mounting sections 34 have a substantially square shape; however, the mounting sections 34 may have other shapes as appropriate, for example, a substantially rectangular shape. On a surface of each mounting section 34, an electrode 36 (see FIG. 2) is formed at a position corresponding to the bump 18 of the semiconductor chip 12 to be mounted.

Next, regarding the configuration of the semiconductor chip 12, as shown in FIG. 4, electrode terminals 14 and 16 are formed on upper and lower surfaces of the semiconductor chip 12. In addition, on one surface of the semiconductor chip 12, the bumps 18 are formed to be continuous with the electrode terminals 14. The bumps 18 are made of a conductive metal and are melted at a predetermined melting temperature Tm.

In addition, a non-conductive film (hereinafter, referred to as "NCF") 20 is attached to the one surface of the semiconductor chip 12 to cover the bumps 18. The NCF 20 functions as an adhesive for adhering the semiconductor chip 12 and the substrate 30 or another semiconductor chip 12, and is made of a non-conductive thermosetting resin, for example, a polyimide resin, an epoxy resin, an acrylic resin, a phenoxy resin, a polyester sulfone resin or the like. A thickness of the NCF 20 is greater than an average height of the bumps 18, and the bumps 18 are almost completely covered by the NCF 20. The NCF 20 is a solid film at room temperature. However, when the temperature exceeds a predetermined softening start temperature Ts, the NCF 20 gradually and reversibly softens and exhibits fluidity, and when the temperature exceeds a predetermined hardening start temperature Tt, irreversible hardening begins.

Here, the softening start temperature Ts is lower than the hardening start temperature Tt and the melting temperature Tm of the bumps 18. The first temperature T1 for the temporary compress-bonding is higher than the softening start temperature Ts and lower than the melting temperature Tm and the hardening start temperature Tt. In addition, the second temperature T2 for the final compress-bonding is higher than the melting temperature Tm and the hardening start temperature Tt. That is, Ts<T1<(Tm, Tt)<T2 is satisfied.

When the semiconductor chip 12 is temporarily compress-bonded to the substrate 30 or the semiconductor chip 12 at a lower side (hereinafter, referred to as a "mounted object" when the two are not distinguished from each other), the mounting head 124 is heated to the first temperature T1 and then the semiconductor chip 12 is pressurized. At this time, due to the heat transfer from the mounting head 124, the NCF 20 of the semiconductor chip 12 is heated to about the first temperature T1and softened, and has fluidity. Then, accordingly, the NCF 20 flows into a gap between the semiconductor chip 12 and the mounted object, and the gap can be reliably filled.

When the semiconductor chip 12 is finally compress-bonded to the mounted object, the mounting head 124 is heated to the second temperature T2 and then the semiconductor chip 12 is pressurized. At this time, the bumps 18 and the NCF 20 of the semiconductor chip 12 are heated to about the second temperature T2 by the heat transfer from the mounting head 124. Accordingly, the bumps 18 can be melted and welded to the opposing mounted object. In addition, the NCF 20 is hardened by this heating in a state that the gap between the semiconductor chip 12 and the mounted object is filled, and thus the semiconductor chip 12 and the mounted object are firmly fixed. That is, at the time of the final compress-bonding, the semiconductor chip 12 is thermally compress-bonded to the substrate 30 or the like.

Here, it takes a certain time to switch the temperature of the mounting head 124 from the first temperature T1 to the second temperature T2 or from the second temperature T2 to the first temperature T1. Therefore, in order to shorten the manufacturing time of the semiconductor device 10, it is effective to reduce the number of times of switching the temperature of the mounting head 124. Therefore, the following process has been proposed, that is, when a plurality of semiconductor chips 12 is laminated and mounted, all the semiconductor chips 12 are temporarily compress-bonded, and then the temporarily compress-bonded semiconductor chips 12 are finally compress-bonded. Specifically, first, temporarily-laminated bodies STt formed by temporarily compress-bonding and laminating the plurality of semiconductor chips 12 using the mounting head 124 heated to the first temperature T1 are formed in the plurality of mounting sections 34. Subsequently, an upper surface of the temporarily-laminated body STt is pressurized by the mounting head 124 switched to the second temperature T2, and thereby the plurality of semiconductor chips 12 configuring the temporarily-laminated body STt is finally compress-bonded collectively. By mounting the semiconductor chip 12 in this procedure, the number of times of switching the temperature of the mounting head 124 can be greatly reduced, and the manufacturing time of the semiconductor device 10 can be significantly reduced.

By the way, as is clear from the above description, in order to appropriately mount the semiconductor chip 12, the semiconductor chip 12 which is the mounted target is desirably heated to an appropriate temperature in accordance with the processing process. For example, when the final compress-bonding is perform, the semiconductor chip 12 is required to be heated to a temperature equal to or higher than the hardening start temperature Tt of the NCF 20 and a temperature equal to or higher than the melting temperature Tm of the bumps 18. However, in some cases, it is difficult to heat all the semiconductor chips 12 to an appropriate temperature only by the heat from the mounting head 124. In particular, when the plurality of semiconductor chips 12 configuring the temporarily-laminated body STt is finally compress-bonded collectively, it is difficult to appropriately heat the semiconductor chip 12 on the lowermost layer only by the heat from the mounting head 124.

In addition, it is desired that a temperature difference between the temperature of the semiconductor chip 12 on the uppermost layer and the temperature of the semiconductor chip 12 on the lowermost layer (hereinafter referred to as "intra-laminated body temperature difference") $\Delta T$ in one temporarily-laminated body STt is small. When the intra-laminated body temperature difference $\Delta T$ is great, variation in mounting quality will be caused. However, it is difficult to reduce the intra-laminated body temperature difference $\Delta T$ only by the heat from the mounting head 124.

Therefore, conventionally, a heater is built in the stage 120 on which the substrate 30 is placed, and usually the entire substrate 30 is also heated. According to this configuration, since the temporarily-laminated body STt is also heated from below, the semiconductor chip 12 on the lowermost layer is also easily heated to an appropriate temperature, and the intra-laminated body temperature difference $\Delta T$ can be reduced to some extent.

However, when the entire stage 120 is heated, the temperature is obviously required to be sufficiently lower than the hardening start temperature Tt of the NCF 20. The reason is that, when the temperature of the stage 120 is higher than the hardening start temperature Tt, the NCF 20 of the semiconductor chip 12 after the temporary compress-bonding and before the final compress-bonding is thermally hardened. Therefore, the temperature of the stage 120 cannot be too high, and it is difficult to sufficiently reduce the intra-laminated body temperature difference $\Delta T$.

In addition, even if the temperature of the stage 120 is lower than the hardening start temperature Tt, when the entire stage 120 is heated, heat will continue to be input for a long time to the semiconductor chips 12 temporarily compress-bonded or finally compress-bonded onto the substrate 30. This long-term heat input causes deterioration of the semiconductor chip 12, especially of the NCF 20, and consequently causes deterioration of the mounting quality.

Figure 5:
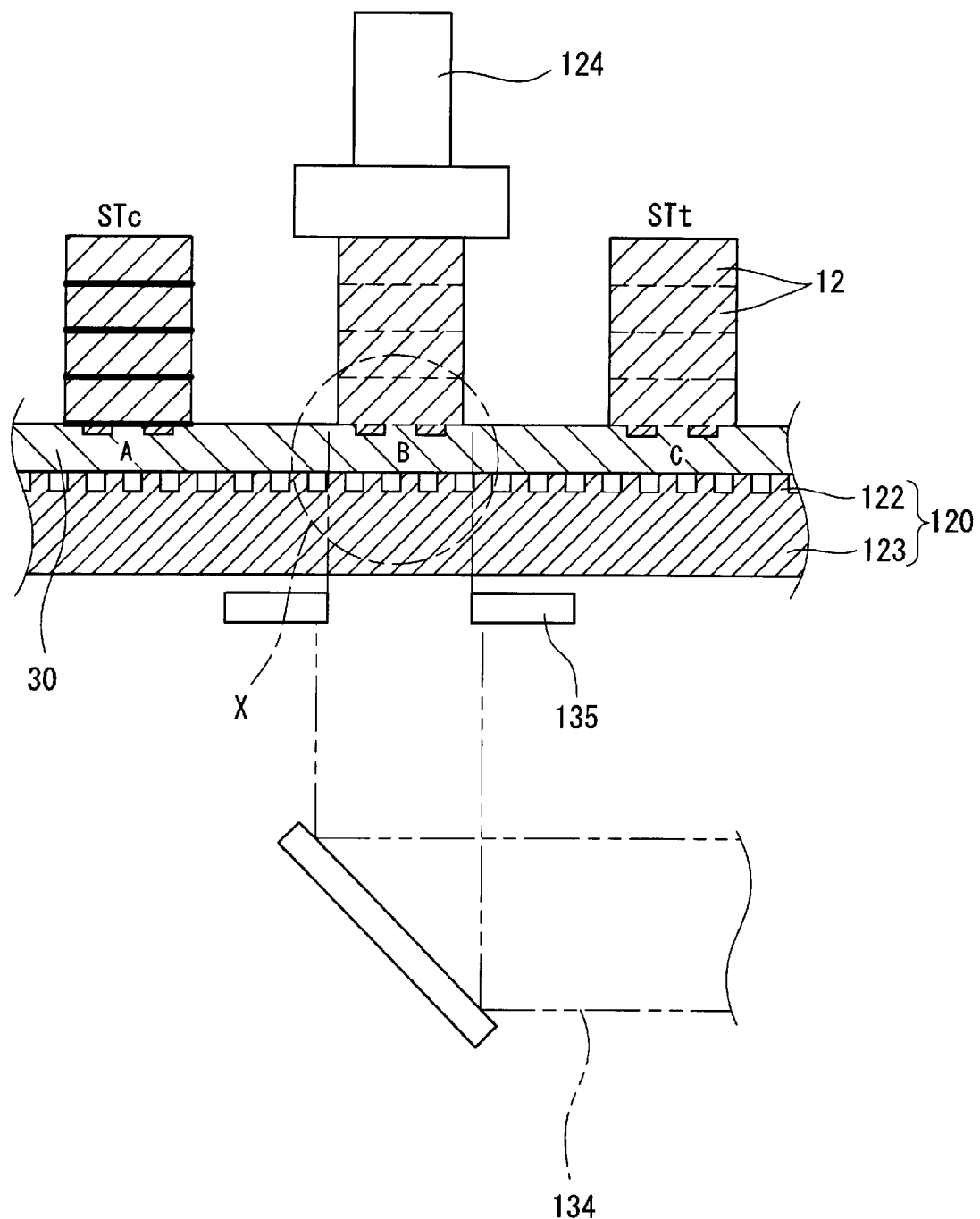
FIG. 5 is a diagram showing a state in which the substrate is locally heated.

Therefore, as described above, in the mounting apparatus 100 disclosed in the specification, the irradiation unit 108 is disposed at the lower side of the stage 120, and the substrate 30 is locally heated by the electromagnetic wave 134. FIG. 5 is an image diagram showing a state that the substrate 30 is locally heated. Moreover, three mounting sections 34 are illustrated in FIG. 5, and in the following description, these mounting sections 34 are referred to as "section A", "section B", and "section C" in order from the left side of the drawing for distinguishing. In FIG. 5, thick lines at boundaries between semiconductor chips 12 and mounted objects (the substrate 30 or another semiconductor chip 12) indicate that final compress-bonding is performed, and broken lines indicate that the temporary compress-bonding is performed. Therefore, in FIG. 5, the laminated body in the section A is a chip laminated body STc that has been finally compress-bonded, and laminated bodies in the sections B and C are temporarily-laminated bodies STt after the temporary compress-bonding and before the final compress-bonding. FIG. 5 shows a state that the temporarily-laminated body STt in the section B is finally compress-bonded.

As shown in FIG. 5, when one temporarily-laminated body STt is finally compress-bonded, the temporarily-laminated body STt is heated and pressurized by the mounting head 124 heated to the second temperature T2. In addition, the section B of the substrate 30 with the temporarily-laminated body STt which is the final compress-bonding target arranged thereon is irradiated with the electromagnetic wave 134, and the section B is heated by the electromagnetic wave 134.

Here, as described above, the electromagnetic wave 134 has a wavelength that easily transmits through the stage 120 and is easily absorbed by the substrate 30. In the example, the substrate 30 is a silicon wafer. The transmittance of silicon drops sharply below a wavelength of 1200 nm. Therefore, when a silicon wafer is used as the substrate 30, the wavelength of the electromagnetic wave 134 is desirably 1200 nm or less. However, when the wavelength is too small, energy of the electromagnetic wave is also reduced, and thus the wavelength of the electromagnetic wave 134 is desirably greater than that of visible light, that is, 750 nm or more.

In addition, it is desirable that the stage 120 has a high transmittance for the electromagnetic wave 134. In addition, it is also desirable that the stage 120 is a material having poor heat conductivity. The reason is to prevent the heat of the mounting section 34 heated by the electromagnetic wave 134 from being transferred to other mounting sections 34 via the stage 120. In order to satisfy the above conditions, the stage 120 is desirably configured by, for example, quartz, barium fluoride, magnesium fluoride, calcium fluoride, or the like.

The irradiation range of the electromagnetic wave 134 is desirably substantially the same as an outer shape of the semiconductor chip 12. In addition, the irradiation unit 108 desirably has a changing part that changes at least one of the irradiation range and the irradiation position of the electromagnetic wave 134 in order to irradiate the electromagnetic wave 134 only to a desired range. Although various configurations of the changing part are conceivable, the changing part may include, for example, a moving mechanism that moves the position of the electromagnetic wave source 132 with respect to the stage 120. The moving mechanism includes, for example, an XY moving mechanism for moving the stage 120. In addition, in order to perform irradiation only on the desired irradiation range, for example, as shown in FIG. 5, the changing part may have a diaphragm 135 which is arranged in the middle of a path of the electromagnetic wave 134 having a diameter sufficiently larger than the irradiation range and which has an opening corresponding to the irradiation range. The diaphragm 135 may be replaced as appropriate according to a target semiconductor device.

In addition, as another aspect, the irradiation range may be scanned with an electromagnetic wave 134 having a diameter sufficiently smaller than the irradiation range near the substrate 30. In order to obtain the small-diameter electromagnetic wave 134 near the substrate 30, the electromagnetic wave source 132 that emits a small-diameter parallel electromagnetic wave (for example, parallel light) may be used, or a large-diameter electromagnetic wave 134 may be focused around the substrate 30 by using an optical member (such as a lens). In addition, in order to scan the electromagnetic wave 134, the electromagnetic wave source 132 may be moved, or a mirror or the like that bends the electromagnetic wave 134 may be moved. As an aspect of moving the mirror, for example, a galvano mirror mechanism that drives two or more mirrors with a galvano motor may be used. In addition, as a mechanism for driving the mirror or the electromagnetic wave source 132, a coil motor or a cam may be used.

As another aspect, in order to perform irradiation only on a desired irradiation range, the profile (the size, the shape or the like) of the electromagnetic wave 134 may be changed using various optical members. For example, a rectangular core fiber having a geometric beam shaping function may be used. In addition, as another aspect, a kaleidoscope having a plurality of mirrors attached to an inner surface of a cylindrical body may be arranged in the middle of the path of the electromagnetic wave 134. Furthermore, the profile of the electromagnetic wave 134 may be changed by using a diffractive lens, a flyer lens, or another optical lens instead of or in addition to the above-described optical members.

In addition, in FIG. 1, only one electromagnetic wave source 132 is shown, but two or more electromagnetic wave sources 132 may be arranged, and the two or more electromagnetic wave sources 132 may be the same type of electromagnetic wave source or different types of electromagnetic wave sources. In addition, the power of the electromagnetic wave 134 is desirably capable of heating the substrate 30 to a desired temperature with a desired time. For example, when the temporarily-laminated body STt is finally compress-bonded collectively, the semiconductor chip 12 on the lowermost layer is desirably heated to the same temperature as the semiconductor chip 12 on the uppermost layer. Usually, the time for performing the final compress-bonding is several seconds, and thus the electromagnetic wave 134 desirably has enough power to be capable of heating the substrate 30 to about the second temperature T2 during the final compress-bonding (within several seconds).

In any case, by irradiating the electromagnetic wave 134 having the wavelength that is easy to transmit through the stage 120 and is easily absorbed by the substrate 30, the electromagnetic wave 134 is absorbed in the substrate 30. Then, by converting the energy of the absorbed electromagnetic wave into heat, only the range of the substrate 30 irradiated with the electromagnetic wave 134 is locally heated. Besides, by locally heating the substrate, the semiconductor chip 12 positioned on the heated part (irradiated part) is also heated. By performing this local heating (irradiation of the electromagnetic wave 134) only to the mounting section 34 in which the final compress-bonding processing is performed, the semiconductor chip 12 on the lowermost layer can also be appropriately heated and good mounting quality can be obtained. In addition, by performing local heating on the mounting section 34 in which the compress-bonding processing is performed, the intra-laminated body temperature difference $\Delta T$ can be reduced, and the mounting quality of a plurality of semiconductor chips 12 configuring one laminated body can be made uniform.

On the other hand, a mounting section 34 that is not subjected to the final compress-bonding processing is not irradiated with the electromagnetic wave 134, and thus temperature rising in the mounting region, and consequently deterioration and degradation caused by heat of a semiconductor chip 12 which is not a target of the final compress-bonding processing can be effectively prevented.

However, when only the mounting section 34 which is the final compress-bonding target is heated by the electromagnetic wave 134, a part of the heat generated in the mounting section 34 is transferred to the substrate 30 or other mounting sections 34 via the stage 120. For example, in FIG. 5, even when only the section B is heated by the electromagnetic wave 134, a part of the heat generated in the section B flows out to the section A or the section C via the substrate 30 and the stage 120. This heat outflow may cause deterioration in thermal efficiency and thermal deterioration of the semiconductor chip 12 in the section A or the section C which is not the target of the final compress-bonding processing.

Therefore, in the mounting apparatus 100 disclosed in the specification, in order to reduce heat transfer to a mounting section other than the mounting section which is the heating target, the stage 120 is configured, as described above, by a material with poor heat conductivity, such as quartz or the like. Furthermore, in the example, a plurality of grooves is formed on the surface of the stage 120 in order to reduce the heat transfer in the plane direction via the stage 120. By forming these grooves, a plurality of air layers (groove parts) exists in the middle of the path toward the plane direction, and the thermal resistance in the plane direction increases. Hereinafter, a part of the stage 120 in which the grooves are formed is referred to as a "first layer 122", and a solid part disposed below the first layer 122 is referred to as a "second layer 123". Since the first layer 122 has the plurality of grooves formed on the surface, the thermal resistance in the plane direction is higher than the thermal resistance in the thickness direction. In addition, the second layer 123 has a solid structure. Therefore, compared with the first layer 122, the second layer 123 has a lower thermal resistance in the plane direction and a higher strength, and is less likely to bend.

A pitch of the grooves formed in the first layer 122 is not particularly limited and may be, for example, sufficiently smaller than one side of the semiconductor chip 12 (for example, the groove pitch is 1/10 or lower of one side of the semiconductor chip). The small groove pitch and the large number of the grooves can alleviate the stress concentration that occurs at contact places between groove edges and the substrate 30, and can consequently equalize pressure applied to all the semiconductor chips 12 when the bonding (the temporary compress-bonding and the final compress-bonding) is performed. In addition, as another aspect, the pitch of the grooves may be the same as the arrangement pitch P of the mounting sections 34, and the grooves may be arranged at substantially the same positions as the boundary lines of the mounting sections 34. In other words, there may be no groove directly under the semiconductor chips 12, and the groove only exists between two semiconductor chips 12 adjacent in the plane direction. With this configuration, the pressure applied to all the semiconductor chips 12 can be further equalized when the bonding (the temporary compress-bonding and the final compress-bonding) is performed. In addition, the grooves formed in the first layer 122 may be communicated with a suction mechanism (not shown) for sucking and holding the substrate 30 placed on the first layer 122.

Figure 6:
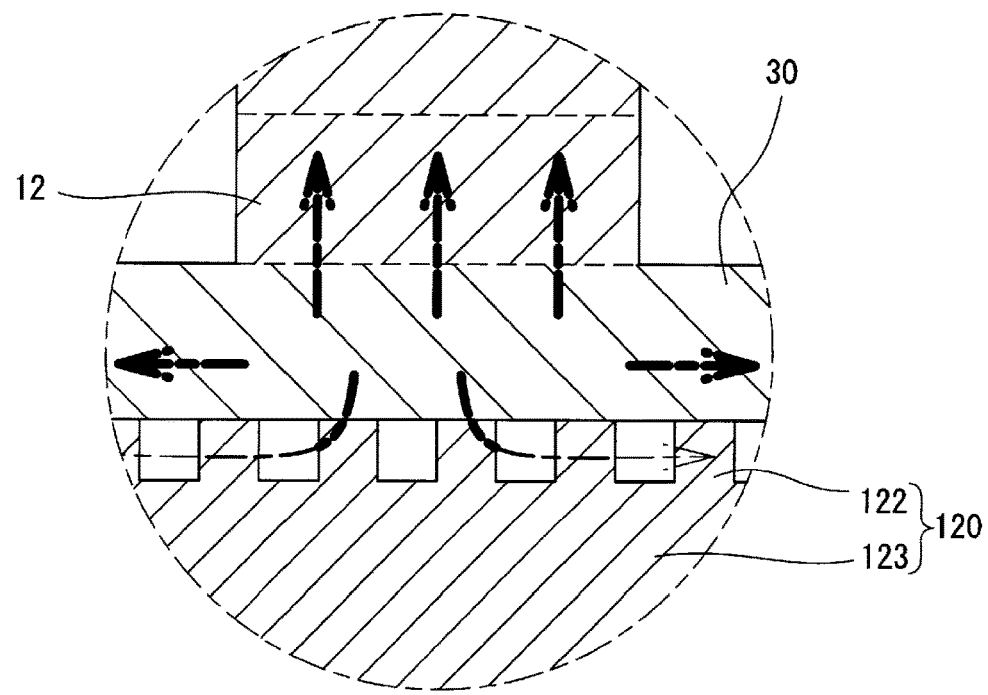
FIG. 6 is an enlarged view of a part X in FIG. 5.

As described above, by arranging the first layer 122 having a higher thermal resistance in the plane direction than the thermal resistance in the thickness direction on a surface layer of the stage 120, the heat transfer toward the plane direction via the stage 120 can be effectively prevented. This situation is described with reference to FIG. 6. FIG. 6 is an enlarged view of a part X in FIG. 5. It is assumed that only the section B is heated with the electromagnetic wave 134 by the irradiation unit 108. In this case, the heat generated in the section B is transferred to an upper side (the semiconductor chip 12 side), the plane direction (the sections A, C side), and a lower side (the stage 120 side). Here, in order to increase the thermal efficiency, among the heat generated in the section B, an amount of heat transferred to the upper side (the semiconductor chip 12 side) is desirably increased, and an amount of heat transferred toward the plane direction (the sections A, C side) and the lower side (the stage 120 side) is desirably reduced. When the substrate 30 is a silicon wafer having high heat conductivity, it is difficult to reduce the heat transfer amount in the plane direction (the sections A, C side). On the other hand, in the example, the stage 120 is configured by a material with high heat insulation, and a plurality of grooves is formed in the surface of the stage 120 to reduce the contact area with the substrate 30, and thus the heat transfer amount to the lower side (the stage 120 side) can be effectively reduced. That is, the stage 120 is configured by the material with high heat insulation, and the contact area between the stage 120 and the substrate 30 is reduced, and thereby the thermal efficiency when the semiconductor chip 12 is heated by the irradiation unit 108 can be improved.

However, the heat transfer amount to the stage 120 is small but cannot be reduced to zero. When the heat transferred to the stage 120 is transferred toward the plane direction (the sections A, C side) via the stage 120, the amount of heat input to the semiconductor chip 12 other than the heating target increases. However, since the stage 120 of the example has the first layer 122 having a high thermal resistance in the plane direction, the heat is effectively prevented from being transferred via the stage 120 toward the plane direction (the sections A, C side). As a result, the amount of heat input to the semiconductor chip 12 other than the heating target can be reduced, and the deterioration or the degradation caused by the heat of the semiconductor chip 12 can be prevented.

Meanwhile, when bonding (temporarily compress-bonding, finally compress-bonding) is performed on the semiconductor chip 12, pressure is applied to the semiconductor chip 12 by using the mounting head 124. When the stage 120 has only the first layer 122 with a high thermal resistance in the plane direction, there is a risk that the stage 120 cannot withstand the load applied during the bonding, and flatness of the substrate 30 cannot be maintained. Therefore, in the example, the second layer 123 having higher rigidity than the first layer 122 is arranged under the first layer 122. Accordingly, even when a great load is applied, the substrate 30 does not bend easily and can maintain the flatness thereof.

Next, flow of manufacturing the semiconductor device 10 using the mounting apparatus 100 is described. When the semiconductor device 10 is manufactured, first, a placing step of placing the substrate 30 directly on the stage 120 is performed. Subsequently, a bonding step of using the mounting head 124 to bond the semiconductor chips 12 to the upper surface of the substrate 30 is performed. The bonding step is further roughly divided into a temporary compress-bonding step and a final compress-bonding step.

In the temporary compress-bonding process, the mounting head 124 laminates a plurality of semiconductor chips 12 while temporarily compress-bonding the plurality of semiconductor chips 12 in all the mounting sections 34 and forms temporarily-laminated bodies STt. Specifically, the mounting head 124 is heated to the first temperature T1 in advance. In this state, first, the stage 120 is horizontally moved, and one mounting section 34 is placed directly below the mounting head 124. Then, the mounting head 124 sucks and holds a front end of the semiconductor chip 12 conveyed by the chip conveyance unit 104, then descends and places the semiconductor chip 12 on a mounted object (the substrate 30 or another semiconductor chip 12) and presses the semiconductor chip 12 with the first load F1. Thereby, the NCF 20 of the semiconductor chip 12 is softened and the semiconductor chip 12 is temporarily compress-bonded. This temporary compress-bonding operation is repeated a plurality of times to form a temporarily-laminated body STt in the one mounting section 34. When the temporarily-laminated body STt is formed in the one mounting section 34, the stage 120 moves horizontally to position another mounting section 34 directly below the mounting head 124. Then, a temporarily-laminated body STt is formed again using the mounting head 124. Hereafter, the same processing is performed for all the mounting sections 34.

When the temporarily-laminated bodies STt are formed in all the mounting sections 34, then the final compress-bonding step is performed. In the final compress-bonding step, the final compress-bonding processing is sequentially performed on the plurality of temporarily-laminated bodies STt. Specifically, the mounting head 124 switches the temperature from the first temperature T1 to the second temperature T2. In addition, in this state, the stage 120 is moved horizontally, and one mounting section 34 is placed directly below the mounting head 124. In this state, the mounting head 124 descends and pressurizes an upper surface of one temporarily-laminated body STt with the second load F2. Thereby, a plurality of semiconductor chips 12 configuring the one temporarily-laminated body STt is final compress-bonded collectively.

Here, in parallel with the final compress-bonding process, a substrate heating step of locally heating the mounting section 34 with the one temporarily-laminated body STt arranged therein is also performed. Specifically, the electromagnetic wave 134 is irradiated on the target mounting section 34 (a region directly below the mounting head 124) and locally heats the mounting section 34 only. Thereby, the temperature of the target mounting section 34 increases, and the semiconductor chip 12 disposed on the mounting section is also heated. Then, the final compress-bonding processing can be performed thereby in a state that the temperature difference between the upper layer and the lower layer of the temporarily-laminated body STt (the intra-laminated body temperature difference $\Delta T$) is small. As a result, the mounting quality of the semiconductor chips 12 can be further improved.

When the one temporarily-laminated body STt is finally compress-bonded, the stage 120 moves horizontally to position another mounting section 34 directly below the mounting head 124. Then, the heating and pressurization of the temporarily-laminated body STt using the mounting head 124 and the local heating of the substrate 30 by the electromagnetic wave 134 are performed again. When the same process is performed for all the mounting sections 34, the manufacturing processing of the semiconductor device 10 is completed.

As is clear from the above description, according to the manufacturing method of the semiconductor device 10 disclosed in the specification, by irradiating the electromagnetic wave 134 to the mounting section 34 of the substrate 30 on which the semiconductor chip 12 which is the heating target is placed, only the mounting section 34 is heated by the electromagnetic wave 134. Thereby, the semiconductor chip 12 which is the heating target can be appropriately heated, and heat can be prevented from being input for a long time to the semiconductor chip 12 which is not a heating target. In addition, the first layer 122 having a higher thermal resistance in the plane direction than the thermal resistance in the thickness direction and the second layer 123 with high rigidity are arranged on the stage 120, and thereby the flatness of the substrate 30 is maintained, and the heat transfer to the semiconductor chip 12 which is not a heating target via the stage 120 is reduced. As a result, the mounting quality of the semiconductor chips 12 can be further improved.

Moreover, the configurations described above are merely examples and may be changed as appropriate. For example, in the above description, a silicon wafer is used as the substrate 30; however, for example, a wafer made of silicon carbide (SiC), gallium nitride (GaN), sapphire, or the like may be used as the substrate 30. In addition, instead of the wafer, a resin substrate or a glass substrate may be used as the substrate 30.

Figure 7:
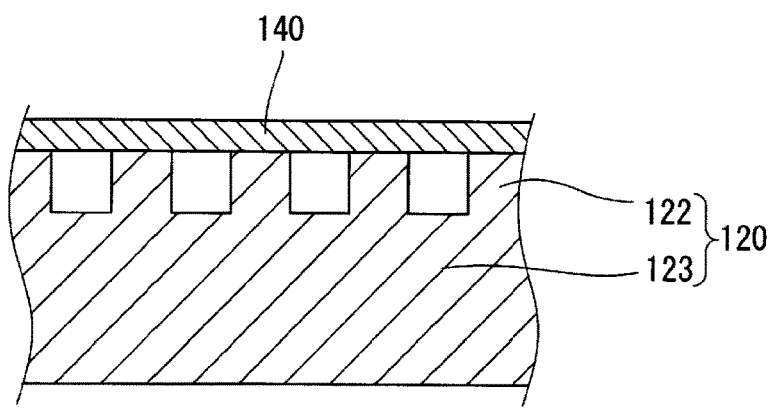
FIG. 7 is a diagram showing another example of the stage.
Figure 8:
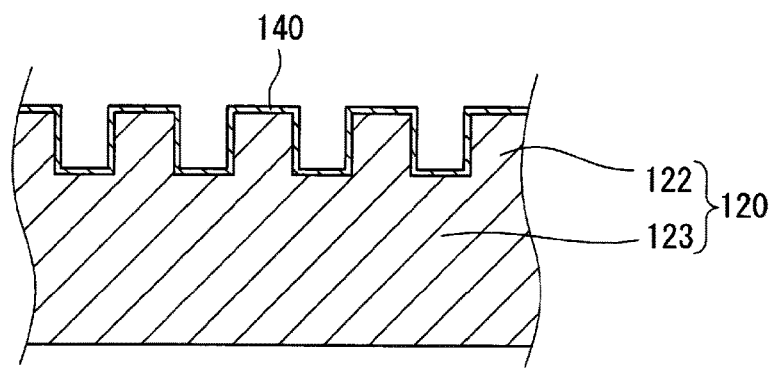
FIG. 8 is a diagram showing another example of the stage.

Meanwhile, some of these substrates and wafers are difficult to be heated with the electromagnetic wave 134. In this case, instead of placing the substrate 30 directly on the stage 120, an intermediate member 140 which absorbs the electromagnetic wave 134 may be arranged between the stage 120 and the substrate 30. The intermediate member 140 is not particularly limited as long as the intermediate member 140 is made of a material that easily absorbs the electromagnetic wave 134. Therefore, the intermediate member 140 may be a substantially flat plate-like member disposed on the upper surface of the stage 120 as shown in FIG. 7. In addition, as another aspect, when the intermediate member 140 is made of a material that absorbs the electromagnetic wave 134, as shown in FIG. 8, the intermediate member 140 may be a coating film (for example, a black body coating film) covering the surface of the stage 120.

In any case, regardless of the type of the substrate 30, by arranging the intermediate member 140 that absorbs the electromagnetic wave 134 between the stage 120 and the substrate 30, the substrate 30 can always be heated by the electromagnetic wave 134. Moreover, when the intermediate member 140 is arranged, the stage 120 may have a structure without the first layer 122. For example, the intermediate member 140 may be placed on a solid block-shaped stage 120, and the substrate 30 may be placed on the intermediate member 140.

Figure 9:
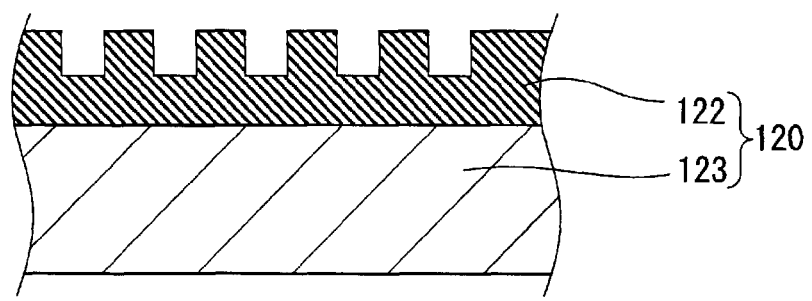
FIG. 9 is a diagram showing another example of the stage.

In addition, in the above description, the first layer 122 arranged in the stage 120 is described as a portion where a plurality of grooves is formed, but the first layer 122 may have another configuration as long as the thermal resistance in the plane direction is higher than the thermal resistance in the thickness direction. For example, as shown in FIG. 9, the first layer 122 and the second layer 123 may be separate members. However, even in this case, it is desirable that both the first layer 122 and the second layer 123 easily transmit the electromagnetic wave 134. In addition, the thermal conductivity of the material configuring the first layer 122 is desirably equal to or lower than the thermal conductivity of the material configuring the second layer 123. Therefore, for example, when the wavelength of the electromagnetic wave 134 is 1200 nm or less and the second layer 123 is made of quartz, the first layer 122 may be made of an optical plastic material through which near infrared rays transmit.

Figure 10:
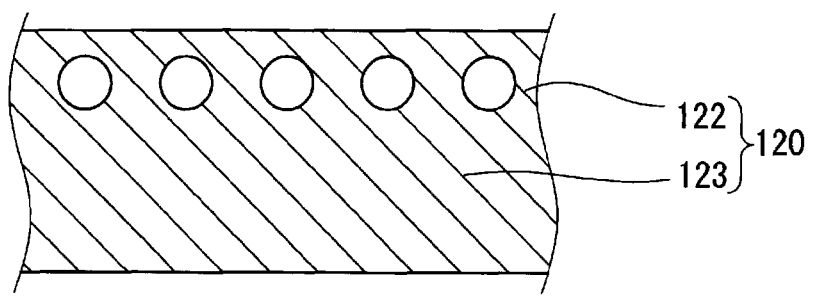
FIG. 10 is a diagram showing another example of the stage.

In addition, as another aspect, the first layer 122 may be processed into a predetermined shape in order to increase the thermal resistance in the plane direction of the first layer 122 greater than the thermal resistance in the thickness direction. Moreover, the "processing" here is not limited to mechanical processing for removing a part of the material by a milling machine or the like, and also includes molding processing such as plastic injection molding. Therefore, for example, the thermal resistance in the plane direction of the first layer 122 may be improved by forming a plurality of grooves as described above or forming holes inside the layer as shown in FIG. 10. In this case, the first layer 122 and the second layer 123 may be integrated or may be separate members.

In addition, in the above description, the substrate 30 is heated by the electromagnetic wave 134 only when the temporarily-laminated bodies STt are finally compress-bonded collectively; however, the substrate 30 may also be heated by the electromagnetic wave 134 during the temporary compress-bonding if necessary. In addition, in the above description, only the case that a plurality of semiconductor chips 12 is laminated and mounted is illustrated, but the technology disclosed in the specification can be naturally applied even when the plurality of semiconductor chips 12 is not laminated and mounted.

In addition, in the above description, there is one mounting head 124 or irradiation unit 108; however, multiple mounting heads 124 or multiple irradiation units 108 may be arranged, and the compress-bonding processing or the heating of the substrate 30 by the electromagnetic wave 134 may be performed simultaneously at multiple places.

REFERENCE SIGNS LIST

10 semiconductor device
12 semiconductor chip
14, 16 electrode terminal
18 bump
30 substrate
34 mounting section
36 electrode
100 mounting apparatus
102 chip supply unit
104 chip conveyance unit
106 bonding unit
108 irradiation unit
110 push-up portion
114 die-picker
116 transfer head
118 rotary table
120 stage
122 first layer
123 second layer
124 mounting head
130 control portion
132 electromagnetic wave source
134 electromagnetic wave
140 intermediate member
STc chip laminated body
STt temporarily-laminated body

What is claimed is:

1. A mounting apparatus for manufacturing a semiconductor device by bonding a semiconductor chip to a mounted object that is a substrate or another semiconductor chip, comprising:
    a stage which has a first surface on which the substrate is placed directly or via an intermediate member and a second surface opposite to the first surface;
    a mounting head that is capable of moving relative to the stage and bonds the semiconductor chip to the mounted object; and
    an irradiation unit that irradiates, from the second surface side, an electromagnetic wave transmitting through the stage and heating the substrate or the intermediate member,
    wherein the mounting head is configured to perform:
    a temporary compress-bonding processing for sequentially forming, at a plurality of places of the substrate, temporarily-laminated bodies obtained by temporarily compress-bonding and laminating one or more semiconductor chips on the substrate; and
    a final compress-bonding processing for sequentially performing, at the plurality of places of the substrate after the temporary compress-bonding processing, processing of finally compress-bonding one or more semiconductor chips configuring one temporarily-laminated body collectively by heating and pressurizing the temporarily-laminated body from an upper surface thereof, and
    wherein the irradiation unit irradiates the electromagnetic wave, in parallel with the finally compress-bonding processing, on places of the substrate or the intermediate member corresponding to the places where the final compress-bonding is performed.

2. The mounting apparatus according to claim 1, wherein the stage has a first layer formed on the first surface side, and
    the first layer has a greater thermal resistance in a plane direction than the thermal resistance in a thickness direction.

3. The mounting apparatus according to claim 2, wherein a plurality of the semiconductor chips is thermally compress-bonded on the substrate, and
    the irradiation unit has a change part which changes at least one of an irradiation region of the electromagnetic wave on the first surface and an irradiation position of the electromagnetic wave on the first surface.

4. The mounting apparatus according to claim 2, wherein the stage further has a second layer formed closer to the second surface side than the first layer, and
    the first layer has a greater thermal resistance in the plane direction than the second layer.

5. The mounting apparatus according to claim 4, wherein the second layer has higher rigidity than the first layer.

6. The mounting apparatus according to claim 4, wherein the second layer is a solid portion made of a material through which the electromagnetic wave transmits, and
    the first layer is a portion in which a plurality of grooves is formed in an upper surface or a plurality of pores is formed in the layer.

7. The mounting apparatus according to claim 1, wherein the substrate is a silicon wafer and is directly placed on the stage,
    the electromagnetic wave has a wavelength of 1200 nm or less, and
    the substrate is locally heated by the electromagnetic wave.

8. The mounting apparatus according to claim 1, wherein the substrate is placed on the stage via the intermediate member,
    the electromagnetic wave has a wavelength which is absorbed by the intermediate member but not absorbed by the substrate, and
    the substrate is locally heated by heat transfer from the intermediate member locally heated by the electromagnetic wave.

9. A manufacturing method of semiconductor device for manufacturing a semiconductor device by bonding a semiconductor chip to a mounted object that is a substrate or another semiconductor chip, comprising:

a placing step for placing the substrate on a first surface of a stage directly or via an intermediate member;

a bonding step for bonding the semiconductor chip to the mounted object by a mounting head capable of moving relative to the stage; and a substrate heating step which is performed in parallel with at least a part of the bonding step and in which the substrate or the intermediate member is heated by irradiating, from an irradiation unit arranged opposite to the mounting head across the stage, an electromagnetic wave which is absorbed by the substrate or the intermediate member and transmits through the stage, wherein the bonding step comprises:

a temporary compress-bonding step for sequentially forming, at a plurality of places of the substrate, temporarily-laminated bodies obtained by temporarily compress-bonding and laminating one or more semiconductor chips on the substrate by the mounting head; and a final compress-bonding step for sequentially performing, at the plurality of places of the substrate after the temporary compress-bonding step, processing of finally compress-bonding one or more semiconductor chips configuring one temporarily-laminated body collectively by heating and pressurizing the temporarily-laminated body from an upper surface thereof, and wherein in the substrate heating step, the electromagnetic wave is irradiated, in parallel with the processing of finally compress-bonding the semiconductor chips collectively, on places of the substrate or the intermediate member corresponding to the places where the final compress-bonding is performed.

10. The manufacturing method of semiconductor device according to claim 9, wherein the stage has a first layer formed on the first surface side, and the first layer has a greater thermal resistance in a plane direction than the thermal resistance in a thickness direction.

11. The mounting apparatus according to claim 5, wherein the second layer is a solid portion made of a material through which the electromagnetic wave transmits, and the first layer is a portion in which a plurality of grooves is formed in an upper surface or a plurality of pores is formed in the layer.

12. The mounting apparatus according to claim 2, wherein the substrate is a silicon wafer and is directly placed on the stage, the electromagnetic wave has a wavelength of 1200 nm or less, and the substrate is locally heated by the electromagnetic wave.

13. The mounting apparatus according to claim 3, wherein the substrate is a silicon wafer and is directly placed on the stage, the electromagnetic wave has a wavelength of 1200 nm or less, and the substrate is locally heated by the electromagnetic wave.

14. The mounting apparatus according to claim 4, wherein the substrate is a silicon wafer and is directly placed on the stage, the electromagnetic wave has a wavelength of 1200 nm or less, and the substrate is locally heated by the electromagnetic wave.

15. The mounting apparatus according to claim 5, wherein the substrate is a silicon wafer and is directly placed on the stage, the electromagnetic wave has a wavelength of 1200 nm or less, and the substrate is locally heated by the electromagnetic wave.

16. The mounting apparatus according to claim 2, wherein the substrate is placed on the stage via the intermediate member, the electromagnetic wave has a wavelength which is absorbed by the intermediate member but not absorbed by the substrate, and the substrate is locally heated by heat transfer from the intermediate member locally heated by the electromagnetic wave.

17. The mounting apparatus according to claim 3, wherein the substrate is placed on the stage via the intermediate member, the electromagnetic wave has a wavelength which is absorbed by the intermediate member but not absorbed by the substrate, and the substrate is locally heated by heat transfer from the intermediate member locally heated by the electromagnetic wave.

18. The mounting apparatus according to claim 4, wherein the substrate is placed on the stage via the intermediate member, the electromagnetic wave has a wavelength which is absorbed by the intermediate member but not absorbed by the substrate, and the substrate is locally heated by heat transfer from the intermediate member locally heated by the electromagnetic wave.

* * * * *